(12) United States Patent
Tsuchioka et al.

(10) Patent No.: US 12,035,580 B2
(45) Date of Patent: Jul. 9, 2024

(54) SEMICONDUCTOR APPARATUS, DISPLAY APPARATUS, AND ELECTRONIC EQUIPMENT

(71) Applicant: Sony Semiconductor Solutions Corporation, Kanagawa (JP)

(72) Inventors: Hiroaki Tsuchioka, Kanagawa (JP); Yosuke Motoyama, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 563 days.

(21) Appl. No.: 17/282,977

(22) PCT Filed: Aug. 28, 2019

(86) PCT No.: PCT/JP2019/033812
§ 371 (c)(1),
(2) Date: Apr. 5, 2021

(87) PCT Pub. No.: WO2020/075410
PCT Pub. Date: Apr. 16, 2020

(65) Prior Publication Data
US 2021/0351257 A1  Nov. 11, 2021

(30) Foreign Application Priority Data
Oct. 12, 2018 (JP) .................... 2018-193604

(51) Int. Cl.
*H10K 59/126* (2023.01)
*H01L 27/146* (2006.01)

(52) U.S. Cl.
CPC ........ *H10K 59/126* (2023.02); *H01L 27/1462* (2013.01); *H01L 27/14621* (2013.01)

(58) Field of Classification Search
CPC ............... H10K 59/126; H10K 50/858; H10K 50/865; H10K 59/38; H10K 50/8426;
(Continued)

(56) References Cited

U.S. PATENT DOCUMENTS

2008/0287028 A1  11/2008  Ozawa
2013/0201575 A1   8/2013  Cheon
(Continued)

FOREIGN PATENT DOCUMENTS

CN  103247234 A  8/2013
JP  2000-30858 A  1/2000
(Continued)

OTHER PUBLICATIONS

International Search Report (PCT/ISA/210), International Application No. PCT/JP2019/033812, dated Nov. 5, 2019.
(Continued)

*Primary Examiner* — Patricia D Valenzuela
(74) *Attorney, Agent, or Firm* — Michael Best & Friedrich LLP

(57) ABSTRACT

A semiconductor apparatus including a layered structure is disclosed. In one example, a first substrate with a light-emitting element and a second substrate with a light-blocking member on a periphery are layered with each other. The layered structure includes a first resin including a photocurable resin that seals a part between the first substrate and the second substrate in a pixel region. A second resin seals a part between the first substrate and the second substrate in a light-blocking region at a periphery. A protrusion structure is arranged between the first substrate and the second substrate in a boundary region between the pixel region and the light-blocking region, and includes a transparent or semi-transparent material that transmits light.

19 Claims, 11 Drawing Sheets

(58) Field of Classification Search
CPC ............... H10K 59/12; H10K 59/8722; H10K 59/879; H10K 59/8792; G02B 3/0006; G02B 5/201; H01L 27/1462; H01L 27/14621
See application file for complete search history.

(56) References Cited

U.S. PATENT DOCUMENTS

| | | | | |
|---|---|---|---|---|
| 2015/0123227 | A1* | 5/2015 | Ootsuka | G02B 3/0068 257/432 |
| 2017/0236860 | A1* | 8/2017 | Yamamoto | H01L 27/14645 257/432 |

FOREIGN PATENT DOCUMENTS

| | | |
|---|---|---|
| JP | 2009-146733 A | 7/2009 |
| JP | 2012-109030 A | 6/2012 |

OTHER PUBLICATIONS

Notification of Transmittal of the International Search Report and the Written Opinion of the International Searching Authority, or the Declaration (PCT/ISA/220), International Application No. PCT/JP2019/033812, dated Nov. 19, 2019.

Written Opinion of the International Search Authority (PCT/ISA/237), International Application No. PCT/JP2019/033812, dated Nov. 19, 2019.

* cited by examiner

SEMICONDUCTOR APPARATUS, DISPLAY APPARATUS, AND ELECTRONIC EQUIPMENT

TECHNICAL FIELD

The present disclosure relates to a semiconductor apparatus, a display apparatus, and electronic equipment.

BACKGROUND ART

In recent years, electronic equipment, such as a viewfinder and an HMD (Head Mounted Display), that realizes AR (Augmented Reality) and VR (Virtual Reality) is actively developed. The electronic equipment is carried or attached to the bodies of the users, and further reduction in the size of the electronic equipment is demanded. Furthermore, a display apparatus that displays video is mounted on the electronic equipment, and it is demanded to widen a video display surface of a display unit (display section) that displays the video, while reducing the size of the outer shape of the display apparatus.

An example of the display unit of the display apparatus includes a display unit disclosed in PTL 1 described below. In order to prevent a second sealant positioned at a center of the display unit from breaking through a first sealant positioned on a periphery when two substrates are pasted together to manufacture the display unit, providing a protrusion for reinforcing the first sealant is disclosed in PTL 1.

CITATION LIST

Patent Literature

[PTL 1]
Japanese Patent Laid-Open No. 2009-146733

SUMMARY

Technical Problems

Conventionally, although an outer frame that surrounds the periphery and that does not transmit light is normally provided in the display unit, a configuration of the display unit not provided with the outer frame is studied in order to widen the video display surface while reducing the size of the outer shape of the display unit.

Moreover, in the configuration of the display unit not provided with the outer frame, providing a light-blocking region on the periphery surrounding the video display surface (pixel region) of the display unit is studied in order to prevent degradation of the image quality of the video displayed in the pixel region. Furthermore, in the case where such a configuration is adopted, a photocurable resin may enter the light-blocking region side from the pixel region in the manufacturing of the display unit, and the photocurable resin entering the light-blocking region may be uncured.

Therefore, in the present disclosure, proposed are novel and improved semiconductor apparatus, display apparatus, and electronic equipment that can prevent a photocurable resin from being uncured and that can also prevent the photocurable resin from entering a light-blocking region from a pixel region.

Solution to Problems

The present disclosure provides a semiconductor apparatus including a layered structure in which a first substrate provided with a light-emitting element and a second substrate provided with a light-blocking member on a periphery are layered with each other, the layered structure including a first resin including a photocurable resin that seals a part between the first substrate and the second substrate in a pixel region positioned at a center in plan view of the layered structure, a second resin that seals a part between the first substrate and the second substrate in a light-blocking region positioned on a periphery in plan view of the layered structure, and a protrusion structure provided between the first substrate and the second substrate in a boundary region between the pixel region and the light-blocking region, the protrusion structure including a transparent or semitransparent material that transmits light.

In addition, the present disclosure provides a display apparatus including a display section including a layered structure in which a first substrate provided with a light-emitting element and a second substrate provided with a light-blocking member on a periphery are layered with each other and a display control unit that controls the display section, the layered structure including a first resin including a photocurable resin that seals a part between the first substrate and the second substrate in a pixel region positioned at a center in plan view of the layered structure, a second resin that seals a part between the first substrate and the second substrate in a light-blocking region positioned on a periphery in plan view of the layered structure, and a protrusion structure provided between the first substrate and the second substrate in a boundary region between the pixel region and the light-blocking region, the protrusion structure including a transparent or semitransparent material that transmits light.

Furthermore, the present disclosure provides electronic equipment including a display section including a layered structure in which a first substrate provided with a light-emitting element and a second substrate provided with a light-blocking member on a periphery are layered with each other and a control unit that controls the display section, the layered structure including a first resin including a photocurable resin that seals a part between the first substrate and the second substrate in a pixel region positioned at a center in plan view of the layered structure, a second resin that seals a part between the first substrate and the second substrate in a light-blocking region positioned on a periphery in plan view of the layered structure, and a protrusion structure provided between the first substrate and the second substrate in a boundary region between the pixel region and the light-blocking region, the protrusion structure including a transparent or semitransparent material that transmits light.

Advantageous Effects of Invention

As described above, the present disclosure can prevent the photocurable resin from being uncured and can also prevent the photocurable resin from entering the light-blocking region from the pixel region.

Note that the advantageous effects are not necessarily limited to the ones described above, and any of the advantageous effects illustrated in the present specification or other advantageous effects that can be recognized from the present specification may be attained in addition to or in place of the advantageous effects described above.

DESCRIPTION OF EMBODIMENTS

Figure 1:
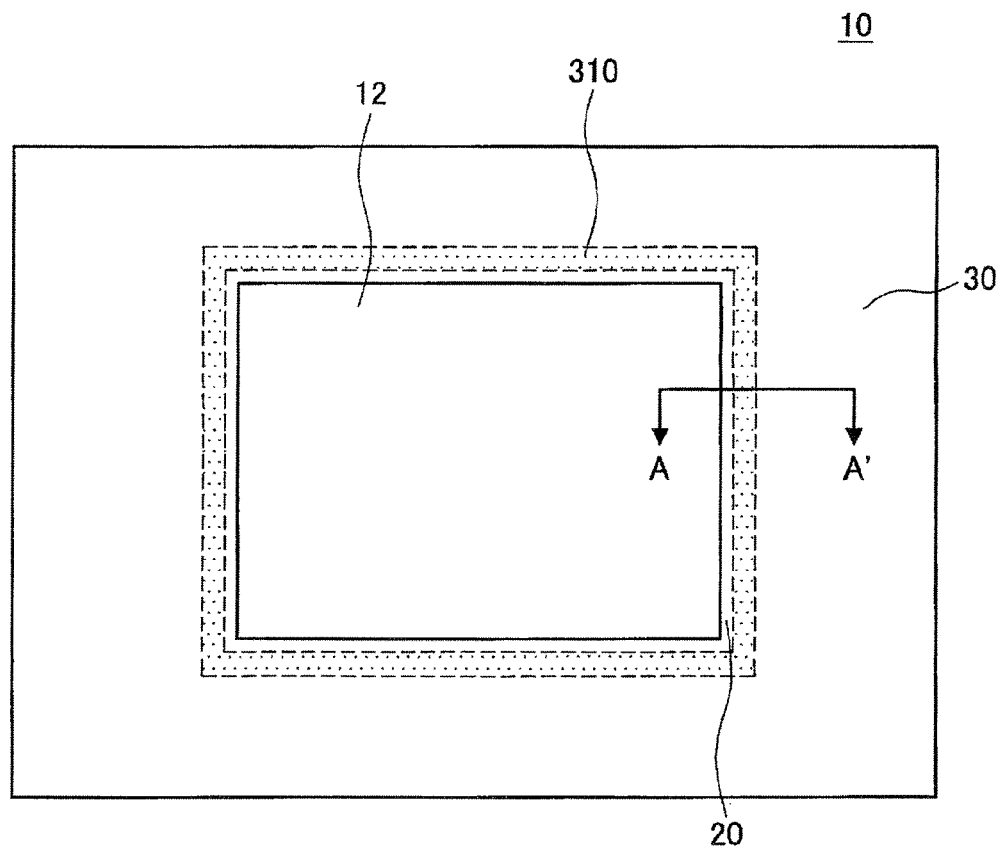
FIG. 1 is a plan view schematically illustrating an example of a configuration of a first display unit 10 of the present disclosure.

Hereinafter, preferred embodiments of the present disclosure will be described in detail with reference to the attached drawings. Note that, in the present specification and the drawings, the same reference signs are provided to constituent elements with substantially the same functional configurations, and the description will not be repeated.

In addition, there are cases in which different alphabets are attached after the same reference signs to distinguish similar constituent elements in different embodiments in the present specification and the drawings. However, only the same reference signs are attached in cases where similar constituent elements do not have to be particularly distinguished.

In addition, the drawings referenced in the following description are drawings for describing the embodiments of the present disclosure and for promoting understanding of the description, and the shapes, the dimensions, the ratios, and the like illustrated in the drawings may be different from those in reality in order to facilitate the understanding of the description. Moreover, the design of a display unit illustrated in the drawings, constituent elements included in the display unit, and the like can be changed appropriately with reference to the following description and known techniques. Further, in the following description, an up and down direction of a layered structure of the display unit corresponds to a relative direction in a case where the display unit is arranged in such a manner that the light emitted by the display unit goes from down to up.

In addition, the description regarding specific lengths and shapes in the following description denotes not only the same values as the mathematically defined numerical values or the geometrically defined shapes, but also includes cases in which there are differences and the like industrially accepted in the manufacturing process of the display unit and includes shapes similar to the shapes.

Furthermore, although examples of cases of applying the embodiments of the present disclosure to the display unit of a display apparatus that displays video will be described below, the embodiments of the present disclosure may be applied not only to such a display unit, but also to a lighting apparatus that emits light.

Note that the embodiments will be described in the following order.

Figure 12:
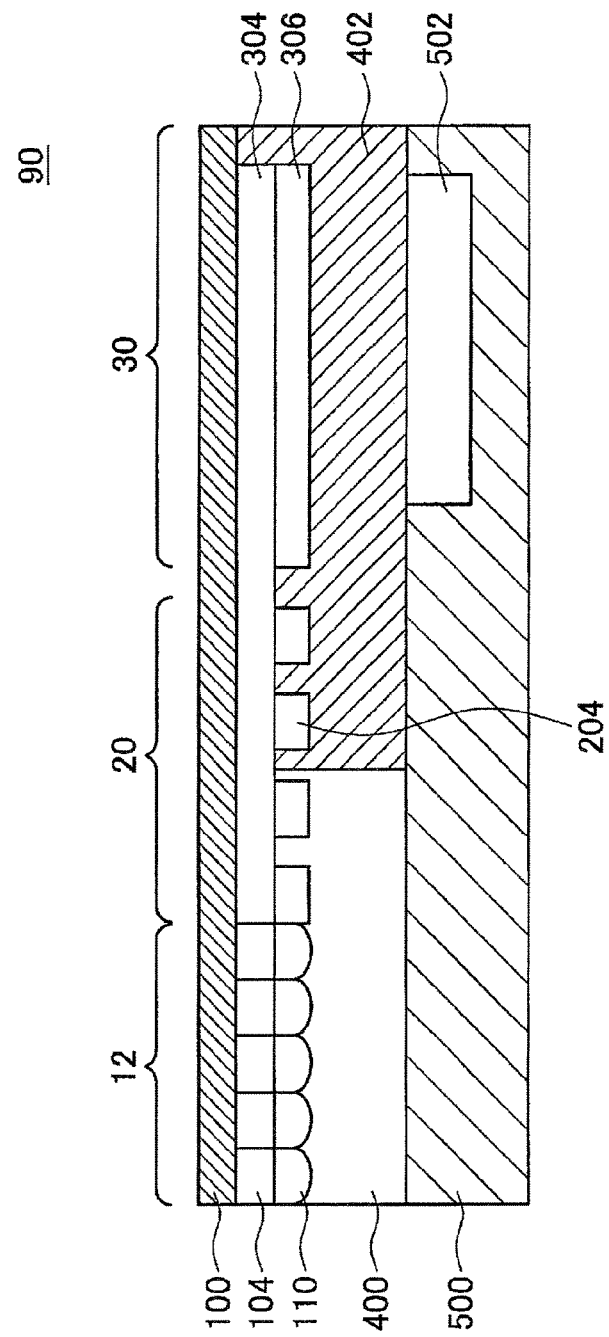
FIG. 12 is a cross-sectional view schematically illustrating an example of a configuration of a display unit 90 according to a comparative example.

1. Background That Led Present Inventors to Create Embodiments of Present Disclosure
2. First Embodiment
3. Second Embodiment
4. Third Embodiment
5. Fourth Embodiment
6. Conclusion
7. Application Examples
8. Supplement 1. Background That Led Present Inventors to Create Embodiments of Present Disclosure First, before describing the details of the embodiments of the present disclosure, the background that led the present inventors to create the embodiments of the present disclosure will be described with reference to FIG. 12. FIG. 12 is a cross-sectional view schematically illustrating an example of a configuration of a display unit 90 in a comparative example, and specifically, FIG. 12 corresponds to a cross section of a case in which the display unit 90 is cut along a line A-A' illustrated in FIG. 1 depicting a plane of a display unit 10. Note that the comparative example here denotes the display unit 90 studied by the present inventors before creating the embodiments of the present disclosure.

As described above, electronic equipment, such as a viewfinder and an HMD, that realizes AR and VR is actively developed in recent years. The electronic equipment is carried or attached to the bodies of the users, and further reduction in the size of the electronic equipment is demanded. Therefore, it is demanded to widen the video display surface of a display unit while reducing the size of the outer shape of a display apparatus mounted on the electronic equipment.

Until now, the display unit has normally been provided with an outer frame that surrounds the periphery of the display unit and that does not transmit light. However, in order to widen the video display surface while reducing the size of the outer shape of the display unit, the present inventors have intensively studied for a configuration of the display unit not provided with the outer frame.

By not providing the outer frame, the video display surface can be widened, while the size of the outer shape of the display unit is reduced. However, according to the study of the present inventors, it has become apparent that there is a case in which light from light-emitting elements of the display unit or outside light entered from the outside of the display unit is reflected by a lower part of the outer frame in the conventional display unit, that is, an electrode including a metal film provided on the periphery, so that the image quality of the displayed video is degraded. Therefore, in order to prevent the degradation of the image quality, the present inventors have conceived of an idea to provide a light-blocking region that blocks light on the periphery of the display unit.

Specifically, the display unit 90 of the comparative example conceived of by the present inventors includes a layered structure including an opposing substrate 100 and a mounted substrate 500 layered with each other as illustrated in FIG. 12. In addition, the part between the opposing substrate 100 and the mounted substrate 500 is sealed by an ultraviolet curable resin 400 in a pixel region 12 that is positioned at the center in plan view of the display unit 90 and that is provided with a plurality of light-emitting elements. Meanwhile, light is blocked in a light-blocking region 30 positioned on the periphery in plan view of the display unit 90, and the part between the opposing substrate 100 and the mounted substrate 500 is sealed by a thermosetting resin 402 instead of the ultraviolet curable resin 400.

Further, as illustrated in FIG. 12, a slit region 20 that partially blocks light is provided between the pixel region 12 and the light-blocking region 30 in the comparative example. By providing the slit region 20 in the comparative example, the light entering through the slit can cure the photocurable resin 400 entering the light-blocking region 30 side from the pixel region 12. That is, providing the slit region 20 prevents the photocurable resin 400 from being uncured in the comparative example.

In a case where the size of the outer shape of the display unit 90 is reduced so that the angle of view of the video display surface is reduced (in a case where the area of the video display surface is reduced), it is difficult to provide the slit region 20 having a sufficient width. According to the study by the present inventors, in the case where the width of the slit region 20 is narrowed down, it is difficult to cure the photocurable resin 400 entering the light-blocking region 30 side from the pixel region 12, and the photocurable resin 400 may be partially uncured.

Thus, in view of the abovementioned circumstances, the present inventors have created the display unit 10 according to the embodiments of the present disclosure that can prevent the photocurable resin 400 from being uncured and that can also prevent the photocurable resin 400 from entering the light-blocking region 30 from the pixel region 12. Specifically, the present inventors have conceived of the idea of providing a protrusion structure 310 (see FIG. 2) that prevents the photocurable resin 400 from entering the light-blocking region 30 from the pixel region 12 and further using a transparent or semitransparent material that transmits light to form the protrusion structure 310. This can prevent the photocurable resin 400 from entering the light-blocking region 30 from the pixel region 12 and can cure the photocurable resin 400 coming around the surroundings or the like of the protrusion structure 310, thereby preventing the photocurable resin 400 from being uncured. Hereinafter, the details of the embodiments of the present disclosure will be described sequentially.

Note that the shapes of the protrusion structure 310 described with reference to FIGS. 2 to 8 denote the shapes in cross section of a case where the protrusion structure 310 is cut along the line A-A' illustrated in FIG. 1 unless otherwise stated.

2. First Embodiment

First, a configuration of the display unit (semiconductor apparatus) 10 according to a first embodiment of the present disclosure will be described with reference to FIGS. 1 and 2. FIG. 1 is a plan view schematically illustrating an example of the configuration of the first display unit 10 according to the present disclosure. In addition, FIG. 2 is a cross-sectional view schematically illustrating an example of the configuration of the display unit 10 according to the present embodiment, and specifically, FIG. 2 corresponds to the cross section in the case where the display unit 10 is cut along the line A-A' illustrated in FIG. 1.

The display unit 10 according to the present embodiment includes a pixel region 12 provided with a plurality of pixels (light-emitting elements) at the center in plan view of the display unit 10 (in a case where the display unit 10 is viewed from above in FIG. 1) as illustrated in FIG. 1, and the pixel region 12 is a video display surface on which video is displayed. In addition, the light-blocking region 30 provided with a light-blocking member is provided on the periphery in plan view of the display unit 10 so as to surround the surroundings of the pixel region 12. Further, in the present embodiment, the protrusion structure 310 is provided in a boundary region of the pixel region 12 and the light-blocking region 30 so as to surround the pixel region 12 in plan view of the display unit 10. In addition, the slit region (slit structure) 20 that partially blocks light is provided between the protrusion structure 310 and the pixel region 12 in plan view of the display unit 10. Note that the details of the protrusion structure 310 will be described later with reference to FIG. 2.

Figure 2:
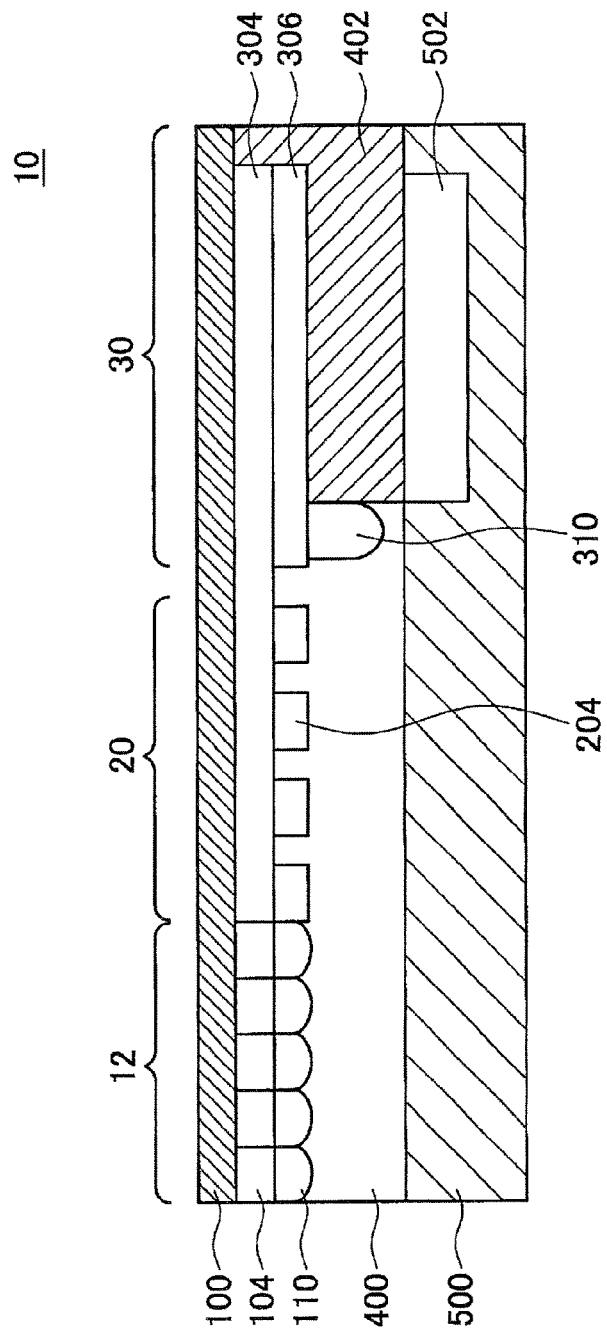
FIG. 2 is a cross-sectional view schematically illustrating an example of the configuration of the display unit 10 according to a first embodiment of the present disclosure.

As illustrated in FIG. 2, the display unit 10 according to the present embodiment includes a layered structure formed by layering the opposing substrate (second substrate) 100 and the mounted substrate (first substrate) 500 with each other. Note that a plurality of light-emitting elements provided on the mounted substrate 500 positioned below micro-lenses 110 of the pixel region 12 is not illustrated in FIG. 2.

The opposing substrate 100 is a light transmissive substrate that transmits light emitted from each light-emitting element (not illustrated) provided on the mounted substrate 500, and for example, the opposing substrate 100 includes a glass substrate or a transparent resin substrate (such as polyethylene terephthalate, acrylic resin, polycarbonate, and polyolefin).

Further, color filters 104, 204, 304, and 306 are provided on a surface of the opposing substrate 100 facing the mounted substrate 500. Specifically, red color filters 104, green color filters 104, and blue color filters 104 with predetermined areas corresponding to the light-emitting elements are provided and distributed in a predetermined arrangement on the surface in the pixel region 12. Further, for example, red color filters 304 and blue color filters 204 provided with a plurality of slits are layered with each other in the slit region 20. Note that the color filters 204 provided with such slits are provided to make an adjustment for partially blocking the light. Further, for example, a structure (light-blocking member) including red color filters 304 and blue color filters 306 layered with each other is provided in the light-blocking region 30 to realize blocking of light. Note that, in the present embodiment, the light-blocking member of the light-blocking region 30 is not limited to the combination of the red color filters 304 and the blue color filters 306, and other combinations may be used. In addition, for example, a material obtained by dispersing pigments or dyes in a transparent binder of silicone or the like is used to form the color filters 104, 204, 304, and 306.

In addition, as illustrated in FIG. 2, the micro-lenses 110 with roundish surface protruding toward the mounted substrate 500 are provided on the color filters 104 of the pixel region 12 so as to correspond to the light emitting elements. For example, the micro-lenses 110 include a resin containing silicone or the like.

Further, as illustrated in FIGS. 1 and 2, the protrusion structure 310 is provided to surround the pixel region 12 in one layer in the boundary region of the pixel region 12 and the light-blocking region 30 in the present embodiment. The protrusion structure 310 prevents the photocurable resin 400 of the pixel region 12 from entering the thermosetting resin 402 side of the light-blocking region 30 in the manufacturing of the display unit 10.

The protrusion structure 310 includes a transparent or semitransparent material that transmits light, and for example, it is preferable that the protrusion structure 310 include a resin containing silicone or the like as in the micro-lenses 110 and the like. In the present embodiment, a material similar to the material of the micro-lenses 110 is used to form the protrusion structure 310. Thus, the protrusion structure 310 can be formed in the same process as the process of the micro-lenses 110 and the like in the manufacturing of the display unit 10, and an increase in the number of processes can be reduced. Further, by using the transparent or semitransparent material that transmits light to form the protrusion structure 310, the light transmitted through the protrusion structure 310 can cure the photocurable resin 400 even in a case where the photocurable resin 400 comes below or around the protrusion structure 310.

Specifically, the protrusion structure 310 is provided to have a cross section of a shape protruding toward the mounted substrate 500, on the color filters 304 and 306 layered on the surface of the opposing substrate 100 facing the mounted substrate 500. Note that an electrode 502 is provided on the surface of the later-described mounted substrate 500 facing the opposing surface 100. Therefore, it is preferable to provide the protrusion structure 310 at a position closer to the pixel region 12 with respect to the electrode 502 in plan view of the display unit 10, or it is preferable to provide the protrusion structure 310 to face the edge of the electrode 502 on the pixel region 12 side.

Further, in the present embodiment, a tip portion of the protrusion structure 310 (edge portion on the drive substrate 500 side) may be in contact with the mounted substrate 500, and for example, the tip portion may be in contact with the electrode 502 on the mounted substrate 500. It is preferable that the shape of the tip portion of the protrusion structure 310 be a hemispherical roundish shape in cross section. Forming the tip portion of the protrusion structure 310 in a roundish shape can prevent the tip portion from damaging the mounted substrate 500 side even if the tip portion comes into contact with the mounted substrate 500. Note that, by using a material similar to the material of the micro-lenses 110 to form the protrusion structure 310, a reflow process or the like can be used to easily process the tip portion of the protrusion structure 310 into a roundish shape like a lens.

Further, in the present embodiment, it is preferable to provide the protrusion structure 310 in such a manner that the tip portion of the protrusion structure 310 is positioned closer to the surface of the mounted substrate 500 on the opposing substrate 100 side with respect to the vertex of each micro-lens 110 (edge portion on the mounted substrate 500 side) as illustrated in FIG. 2. In the present embodiment, the distance between the opposing substrate 100 and the mounted substrate 500 is adjusted based on the length of the protrusion structure 310 in the layer direction of the layered structure of the display unit 10 (length in the up and down direction in FIG. 2), and an appropriate distance is secured for the distance between the micro-lenses 110 and the mounted substrate 500. In the display unit 10, the distance between the micro-lenses 110 and the light-emitting elements (not illustrated) provided on the mounted substrate 500 is one of the parameters that affect the optical characteristics in the display unit 10. Therefore, in the present embodiment, the distance between the opposing substrate 100 and the mounted substrate 500 is adjusted based on the length of the protrusion structure 310, and an appropriate distance is secured for the distance between the micro-lenses 110 and the light-emitting elements on the mounted substrate 500.

Specifically, in the present embodiment, it is preferable to set the length of the micro-lenses 110 in the layer direction of the layered structure of the display unit 10 (length in the up and down direction in FIG. 2) to approximately 1.5 to 2.5 μm, and it is preferable to set the length of the protrusion structure 310 to approximately 3 μm, for example. Further, in the present embodiment, the thickness of the color filters 306 may be set to approximately 0.3 to 1.0 μm in order to adjust the distance between the opposing substrate 100 and the mounted substrate 500.

In addition, it is preferable that the width of the protrusion structure 310 (length in the up and down direction in FIG. 2) be narrower in order to prevent the tip portion of the protrusion structure 310 from damaging the mounted substrate 500 side as described above. However, the strength of the protrusion structure 310 becomes weak in the case where the width is narrowed down, and the effect of the protrusion structure 310 preventing the photocurable resin 400 from entering the thermosetting resin 402 side of the light-blocking region 30 may not be obtained. Further, the amount of the photocurable resin 400 coming around the protrusion structure 310 increases in the case where the width of the protrusion structure 310 is narrowed down, and this also leads to an increase in the possibility that the photocurable resin 400 is uncured. Thus, in the present embodiment, it is preferable to select the width of the protrusion structure 310 so as to maintain the strength of the protrusion structure 310 at a level that can prevent the entrance of the photocurable resin 400 while preventing damage to the mounted substrate 500 side. Specifically, in the present embodiment, it is preferable to set the width of the micro-lenses 110 (length in the left and right direction in FIG. 2) to approximately several μm and to set the width of the protrusion structure 310 to approximately several 10 to 100 μm, for example.

The mounted substrate 500 includes, for example, a single crystal, polycrystalline, or amorphous silicon substrate, a glass substrate, a plastic substrate, or the like. On the mounted substrate 500, a plurality of light-emitting elements corresponding to pixels is provided in a matrix in the pixel region 12, although not illustrated. Note that the plurality of light-emitting elements included in the pixel region 12 includes a plurality of light-emitting elements corresponding to effective pixels used for displaying video and may further include a plurality of light-emitting elements corresponding to dummy pixels not used for displaying video. Each light-emitting element includes, for example, a light-emitting layer and two electrode layers sandwiching the light-emitting layer in the up and down direction in FIG. 2, and the light-emitting element can emit light as a result of application of an electric field to the light-emitting layer. Note that, in the present embodiment, the light-emitting layer may be an organic light-emitting layer or may be an inorganic light-emitting layer, and the light-emitting layer is not particularly limited. Further, in the present embodiment, all of the light-emitting elements may be formed to have the same structure or may be formed to have different structures, and the structure is not particularly limited.

Further, in the present embodiment, wiring (not illustrated), transistors (not illustrated), and the like electrically connected to the light-emitting elements may be provided on the mounted substrate 500. The transistors can, for example, control the drive of the light-emitting elements to display desired video on the video display surface of the display unit 10.

Further, in the present embodiment, the electrode 502 is provided on the mounted substrate 500 so as to face the structure (light-blocking member) including the red color filters 304 and the blue color filters 306 layered with each other, as illustrated in FIG. 2. The electrode 502 includes a metal material or the like and is, for example, electrically connected to the transistors and the like provided on the mounted substrate 500.

Further, the display unit 10 according to the present embodiment is formed by layering the opposing substrate 100 and the mounted substrate 500 with each other as described above, and the display unit 10 includes the photocurable resin (first resin) 400 and the thermosetting resin (second resin) 402 for sealing the part between the substrates.

Specifically, the part between the opposing substrate 100 and the mounted substrate 500 is sealed by the photocurable resin 400 in the pixel region 12 and the slit region 20. In the present embodiment, the photocurable resin 400 is a photocurable resin cured by ultraviolet rays or visible light, and examples of the photocurable resin 400 include a silicone resin, an epoxy resin, and an acrylic resin. The photocurable resin 400 is cured by ultraviolet rays or visible light transmitted through the opposing substrate 100, the color filters 104 and 304, and the micro-lenses 110 in the manufacturing of the display unit 10, and the photocurable resin 400 seals the part between the opposing substrate 100 and the mounted substrate 500.

Meanwhile, the part between the opposing substrate 100 and the mounted substrate 500 is sealed by the thermosetting resin 402 in the light-blocking region 30. In the present embodiment, the thermosetting resin 402 is a thermosetting resin cured by applied heat, and examples of the thermosetting resin 402 include an acrylic resin, a urethane resin, an epoxy resin, and a silicone resin. The thermosetting resin 402 is cured by heat applied to the light-blocking region 30 in the manufacturing of the display unit 10, and the thermosetting resin 402 seals the part between the opposing substrate 100 and the mounted substrate 500.

Note that, in the present embodiment, the resin used for sealing the light-blocking region 30 is not limited to thermosetting resin, and for example, an energy ray curable resin, the photocurable resin as described above, or other resins may be used. Examples of the energy ray curable resin include an acrylic resin, a urethane resin, an epoxy resin, and a silicone resin cured by energy rays, such as an electron beam, a laser beam, ionizing radiation (such as X-ray, α-ray, β-ray, and γ-ray), a microwave, and a high frequency.

Note that, in the present embodiment, at least part of the surface of the tip portion of the protrusion structure 310 may be covered by the photocurable resin 400 as illustrated in FIG. 2 and/or may be covered by the thermosetting resin 402. In the present embodiment, even in a case where either one of or both the photocurable resin 400 and the thermosetting resin 402 come around the protrusion structure 310, the light transmitted through the protrusion structure 310 and the heat applied to the light-blocking region 30 can cure the resins.

As described above, light and heat can be applied to cure the photocurable resin 400 and the thermosetting resin 402, respectively, to seal the part between the opposing substrate 100 and the mounted substrate 500 layered with each other in the present embodiment. In the present embodiment, providing the protrusion structure 310 can prevent the photocurable resin 400 from entering the thermosetting resin 402 side of the light-blocking region 30. As a result, the present embodiment can narrow down the width of the slit region 20 as a buffer for preventing the photocurable resin 400 from entering the light-blocking region 30, while curing the entered photocurable resin 400, and the pixel region 12 can be widened. Further, in the present embodiment, the light transmitted through the protrusion structure 310 can cure the photocurable resin 400 even in the case where the photocurable resin 400 comes below or around the protrusion structure 310. That is, the present embodiment can prevent the photocurable resin 400 from being uncured and can also prevent the photocurable resin 400 from entering the light-blocking region 30 from the pixel region 12.

Note that the display unit 10 according to the present embodiment is not limited to such mode as that illustrated in FIGS. 1 and 2. For example, the protrusion structure 310 may be provided on the surface of the mounted substrate 500 on the opposing substrate 100 side and may have a shape protruding from the mounted substrate 500 toward the opposing substrate 100. In this case, it is also preferable that the protrusion structure 310 be provided at a position closer to the pixel region 12 with respect to the electrode 502 in plan view of the display unit 10. The protrusion structure 310 can also prevent the photocurable resin 400 from entering the thermosetting resin 402 side of the light-blocking region 30 in the case where the protrusion structure 310 protruding from the mounted substrate 500 toward the opposing substrate 100 is provided. Further, even in such a case, the photocurable resin 400 coming above or around the protrusion structure 310 can be cured by the light transmitted through the protrusion structure 310.

3. Second Embodiment

Figure 3:
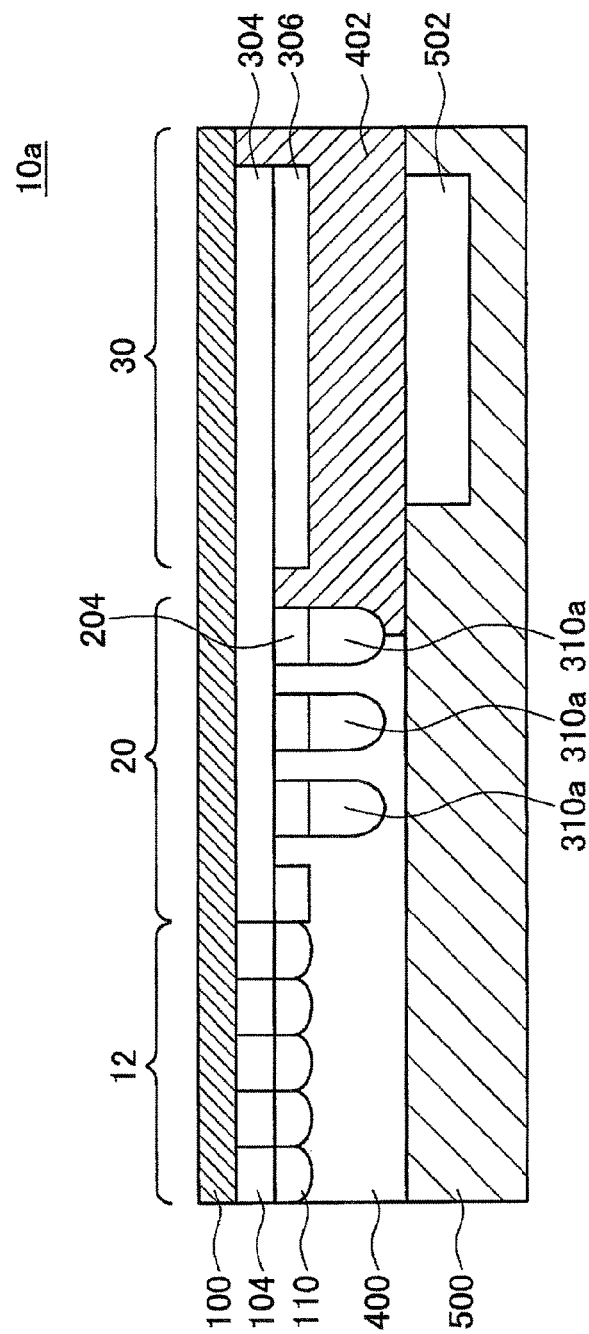
FIG. 3 is a cross-sectional view schematically illustrating an example of a configuration of a display unit 10a according to a second embodiment of the present disclosure.

In the first embodiment, the protrusion structure 310 is provided to surround the pixel region 12 by one layer. However, in the embodiments of the present disclosure, the arrangement of the protrusion structure 310 is not limited to the arrangement in which the protrusion structure 310 is provided to surround the pixel region 12 by one layer, and the protrusion structure 310 may be provided to surround the pixel region 12 by two layers or three layers. AS described above, providing the protrusion structure 310 to surround the pixel region 12 by two layers or three layers can further prevent the photocurable resin 400 from entering the light-blocking region 30 side. Hereinafter, a display unit 10a according to a second embodiment of the present disclosure including three protrusion structures 310a provided to surround the pixel region 12 by three layers will be described with reference to FIG. 3. FIG. 3 is a cross-sectional view schematically illustrating an example of a configuration of the display unit 10a according to the second embodiment of the present disclosure, and FIG. 3 corresponds to a cross section of a case in which the display unit 10a is cut along the line A-A' illustrated in FIG. 1.

In the present embodiment, three protrusion structures 310a are provided to surround the pixel region 12 by three layers in the boundary region of the pixel region 12 and the light-blocking region 30. Specifically, in the cross-sectional view of FIG. 3, three protrusion structures 310a are provided to line up in the direction from the pixel region 12 toward the light-blocking region 30. It is preferable that the protrusion structures 310a include a transparent or semitransparent material that transmits light as in the first embodiment, and as illustrated in FIG. 3, the protrusion structures 310a may be provided on the color filters 204 including a plurality of slits provided on the color filters 304.

In the present embodiment, it is also preferable to provide the three protrusion structures 310a at positions closer to the pixel region 12 with respect to the electrode 502 in plan view of the display unit 10. Alternatively, the protrusion structure 310a positioned closest to the light-blocking region 30 may be provided to face the edge of the electrode 502 on the mounted substrate 500 on the pixel region 12 side. In addition, tip portions of the three protrusion structures 310a may be in contact with the mounted substrate 500 in the present embodiment.

In this way, according to the present embodiment, providing the three protrusion structures 310a to surround the pixel region 12 by three layers can further prevent the photocurable resin 400 from entering the light-blocking region 30. Further, in the present embodiment, the photocurable resin 400 can also be cured by the light transmitted through the protrusion structures 310a even in a case where the photocurable resin 400 comes below or around the protrusion structures 310a.

Note that the present embodiment is not limited to the arrangement of providing the three protrusion structures 310a provided to surround the pixel region 12 by three layers as illustrated in FIG. 3. For example, two protrusion structures 310a surrounding the pixel region 12 by two layers may be provided in the present embodiment, or a plurality of protrusion structures 310a surrounding the pixel region 12 by four or more layers may be provided. The arrangement is not particularly limited.

Figure 4:
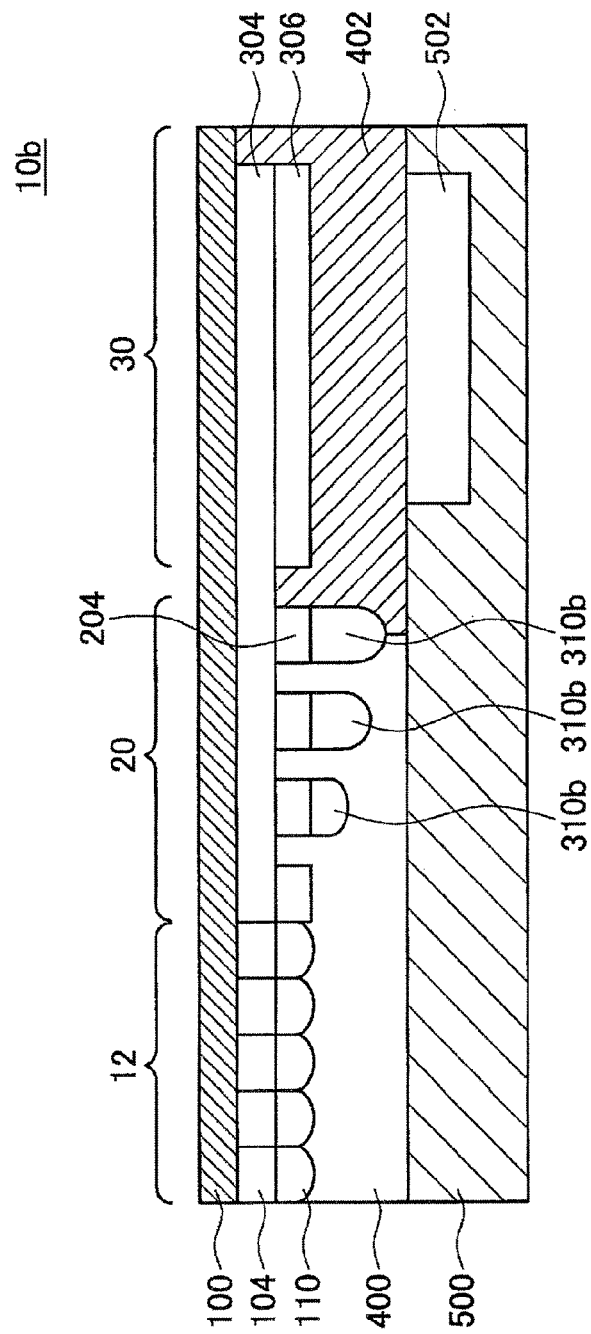
FIG. 4 is a cross-sectional view schematically illustrating an example of a configuration of a display unit 10b according to a modification of the second embodiment of the present disclosure.

Further, the present embodiment can also be modified as illustrated in FIG. 4. Hereinafter, the modification of the present embodiment will be described with reference to FIG. 4. FIG. 4 is a cross-sectional view schematically illustrating an example of a configuration of a display unit 10b according to the modification of the present embodiment, and FIG. 4 corresponds to a cross section of a case in which the display unit 10b is cut along the line A-A' illustrated in FIG. 1.

As illustrated in FIG. 4, three protrusion structures 310b are provided in the present modification so as to surround the pixel region 12 by three layers in the boundary region of the pixel region 12 and the light-blocking region 30 as in the second embodiment. Further, the three protrusion structures 310b are provided in the present modification so that the lengths of the three protrusion structures 310b in the layer direction of the layered structure of the display unit 10 (lengths in the up and down direction of FIG. 4) sequentially increase in the direction from the pixel region 12 toward the light-blocking region 30. In the present modification, a tip portion of the protrusion structure 310b of the three protrusion structures 310a that is positioned closest to the light-blocking region 30 may be in contact with the mounted substrate 500. In the present modification, the length of the protrusion structure 310b positioned closest to the light-blocking region 30 can also be adjusted to adjust the distance between the opposing substrate 100 and the mounted substrate 500, and an appropriate distance can be secured for the distance between the micro-lenses 110 and the light-emitting elements (not illustrated) on the mounted substrate 500.

In the present modification, providing the three protrusion structures 310b can prevent the photocurable resin 400 from entering the light-blocking region 30. In addition, the three protrusion structures 310b are provided in the present modification in such a manner that the lengths of the three protrusion structures 310b in the layer direction of the layered structure of the display unit 10 sequentially increase in the direction from the pixel region 12 toward the light-blocking region 30. Thus, even if the tip portion of the protrusion structure 310b comes into contact with the mounted substrate 500, only the tip portion of the protrusion structure 310b positioned closest to the light-blocking region 30 can come into contact with the mounted substrate 500 in the present modification, and the area in contact with the mounted substrate 500 can be further reduced. As a result, the present modification can further prevent the tip portions from damaging the mounted substrate 500 side.

Note that the present modification is also not limited to the arrangement of the three protrusion structures 310b provided to surround the pixel region 12 by three layers as illustrated FIG. 4. For example, two protrusion structures 310b surrounding the pixel region 12 in two layers may be provided in the present modification, or a plurality of protrusion structures 310b surrounding the pixel regions 12 in four or more layers may be provided. The arrangement is not particularly limited.

4. Third Embodiment

In the first embodiment, a material similar to the material of the micro-lenses 110 and the like is used to form the protrusion structure 310. However, just a transparent or semitransparent material that transmits light needs to be used to form the protrusion structure 310 in the embodiments of the present disclosure, and the material is not limited to the material similar to the material of the micro-lenses 110. In the embodiments of the present disclosure, for example, a material similar to the material of the color filters 104, 204, 304, and 306 and the like may be used to form the protrusion structure 310. In this way, a material similar to the material of the color filters 104 and the like can be used to form the protrusion structure 310, so that the protrusion structure 310 is formed in the same process as the process of the color filters 104 and the like in the manufacturing of the display unit 10, and an increase in the number of processes can be reduced.

Figure 5:
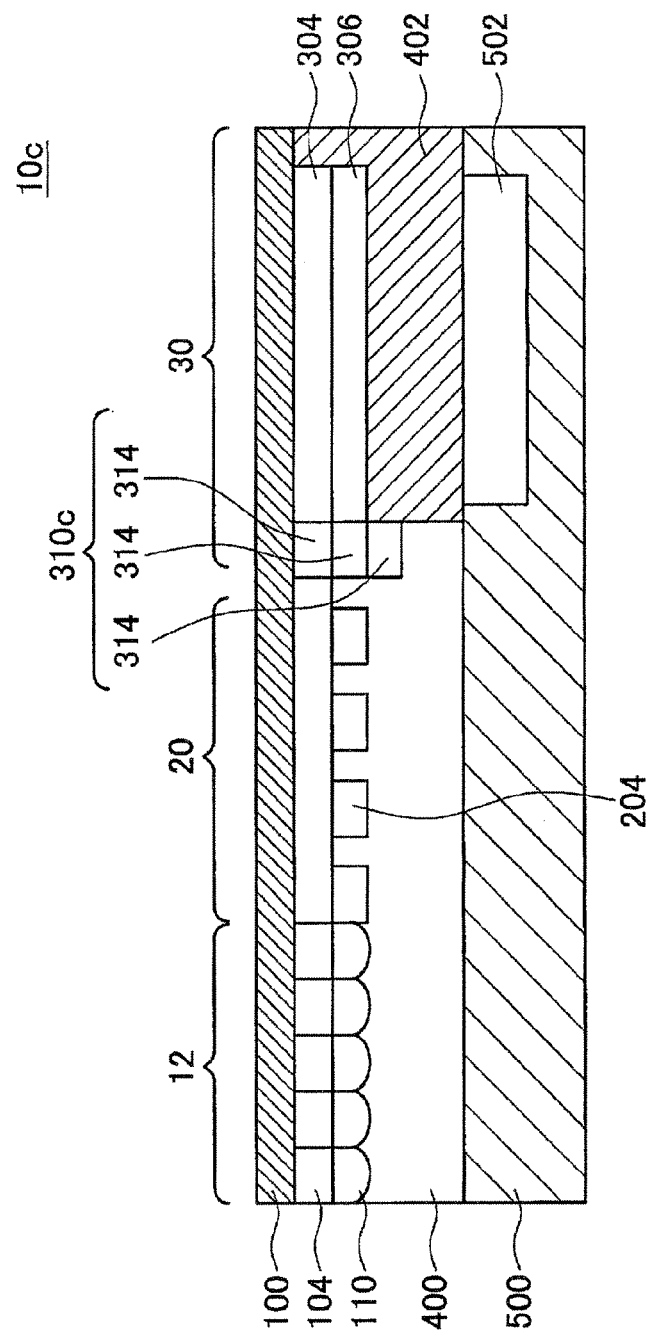
FIG. 5 is a cross-sectional view schematically illustrating an example of a configuration of a display unit 10c according to a third embodiment of the present disclosure.

Hereinafter, a display unit 10c according to a third embodiment of the present disclosure including a protrusion structure 310c that includes a material similar to the material of the color filters 104 and the like will be described with reference to FIG. 5. FIG. 5 is a cross-sectional view schematically illustrating an example of a configuration of the display unit 10c according to the third embodiment of the present disclosure, and FIG. 5 corresponds to a cross section of a case in which the display unit 10c is cut along the line A-A' illustrated in FIG. 1.

As described above, in the display unit 10, the distance between the micro-lenses 110 and the light-emitting elements (not illustrated) provided on the mounted substrate 500 is one of the parameters that affect the optical characteristics in the display unit 10. Thus, the distance between the micro-lenses 110 and the light-emitting elements, that is, the distance between the micro-lenses 110 and the mounted substrate 500, needs to be accurately adjusted in the manufacturing of the display unit 10.

Thus, a material similar to the material of the color filters 104 and the like is used to form the protrusion structure 310c in order to more accurately adjust the length of the protrusion structure 310c in the layer direction of the layered structure of the display unit 10c (length in the up and down direction in FIG. 5) in the present embodiment. The film thickness of the material of the color filters 104 and the like can be easily adjusted, and the material can also be easily processed. Thus, a material similar to the material of the color filters 104 and the like can be used to form the protrusion structure 310, so that the length of the protrusion structure 310c can be adjusted more accurately.

Specifically, as illustrated in FIG. 5, three color filters 314 are layered with each other to form the protrusion structure 310c in the present embodiment. The three color filters 314 are, for example, color filters 314 of three different colors. However, the combination of the colors of the three color filters 314 is not particularly limited in the present embodiment.

Further, the protrusion structure 310c is provided on the opposing substrate 100 and has a columnar shape protruding toward the mounted substrate 500 as in the embodiments so far. In addition, although it is preferable that the shape of a tip portion of the protrusion structure 310c be a hemispherical roundish shape as in the embodiments so far, the tip portion may be flat as illustrated in FIG. 5 (specifically, a shape with a surface substantially parallel to the opposing surface of the mounted substrate 500).

In this way, according to the present embodiment, the color filters 314 that allow easy adjustment of the film thickness and easy processing are used to form the protrusion structure 301c, and the length of the protrusion structure 310c can be more accurately adjusted. Further, according to the present embodiment, by using a material similar to the material of the color filters 104 and the like to form the protrusion structure 310c, the protrusion structure 310c can be formed in the same process as the process of the color filters 104 and the like in the manufacturing of the display unit 10c, and an increase in the number of processes can be reduced.

Figure 6:
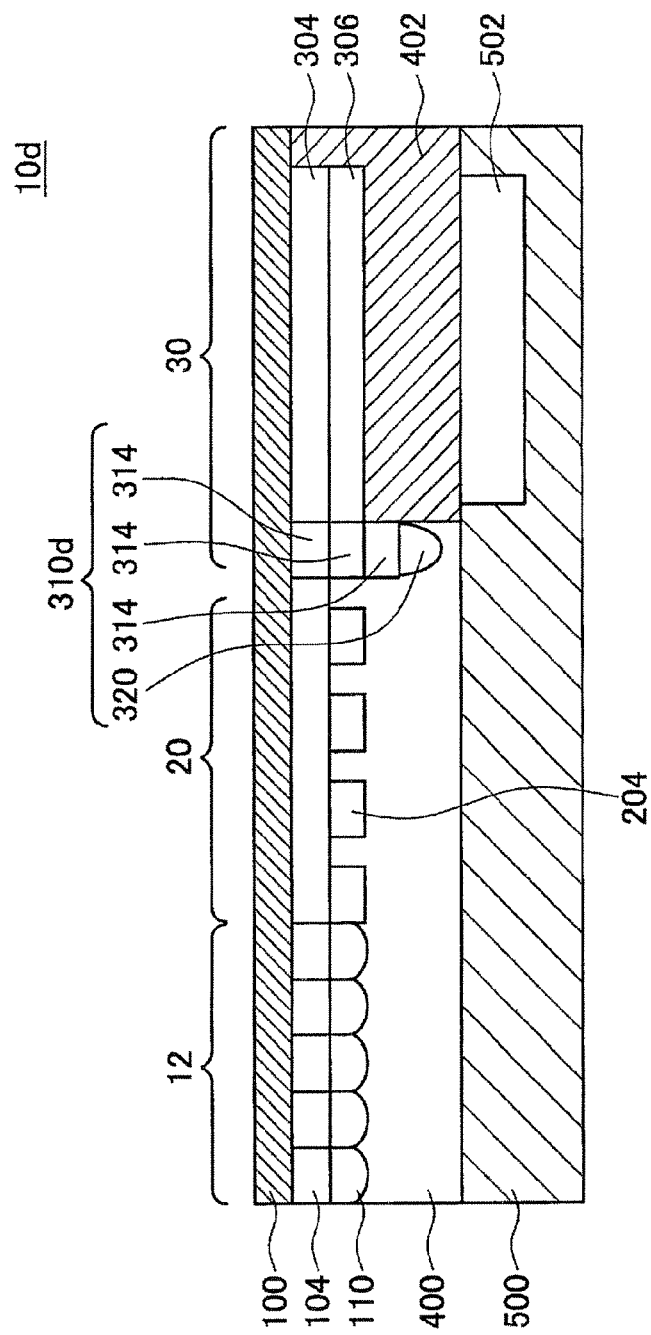
FIG. 6 is a cross-sectional view schematically illustrating an example of a configuration of a display unit 10d according to a modification of the third embodiment of the present disclosure.

Further, the present embodiment can also be modified as illustrated in FIG. 6. Hereinafter, the modification of the present embodiment will be described with reference to FIG. 6. FIG. 6 is a cross-sectional view schematically illustrating an example of a configuration of a display unit 10d according to the modification of the present embodiment, and FIG. 6 corresponds to a cross section of a case in which the display unit 10d is cut along the line A-A' illustrated in FIG. 1.

As illustrated in FIG. 6, in the present modification, the color filters 314 that allow easy adjustment of the film thickness and easy processing are used to form a protrusion structure 310d, as in the third embodiment. Further, a micro-lens 320 is formed on the three color filters 314 layered with each other, to form the protrusion structure 310d including a tip portion in a hemispherical roundish shape in the present modification.

In the present modification, the color filters 314 that allow easy adjustment of the film thickness and easy processing and the micro-lens 320 are combined to form the protrusion structure 310d, and the length of the protrusion structure 310d can be more accurately adjusted. Further, a material similar to the material of the color filters 104 and the like can also be used to form the protrusion structure 310d in the present modification, and the protrusion structure 310d can be formed in the same process as the process of the color filters 104 and the like in the manufacturing of the display unit 10d. Therefore, an increase in the number of processes can be reduced.

5. Fourth Embodiment

Figure 7:
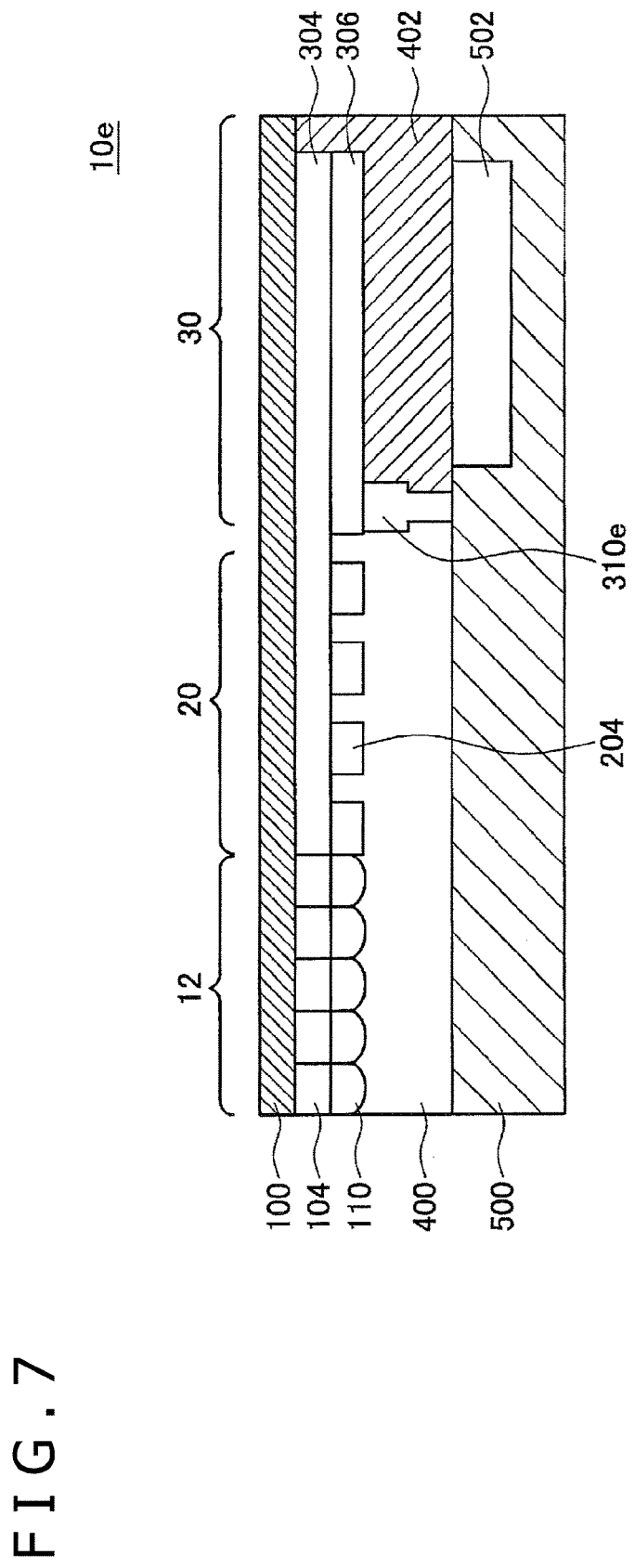
FIG. 7 is a cross-sectional view schematically illustrating an example of a configuration of a display unit 10e according to a fourth embodiment of the present disclosure.
Figure 8:
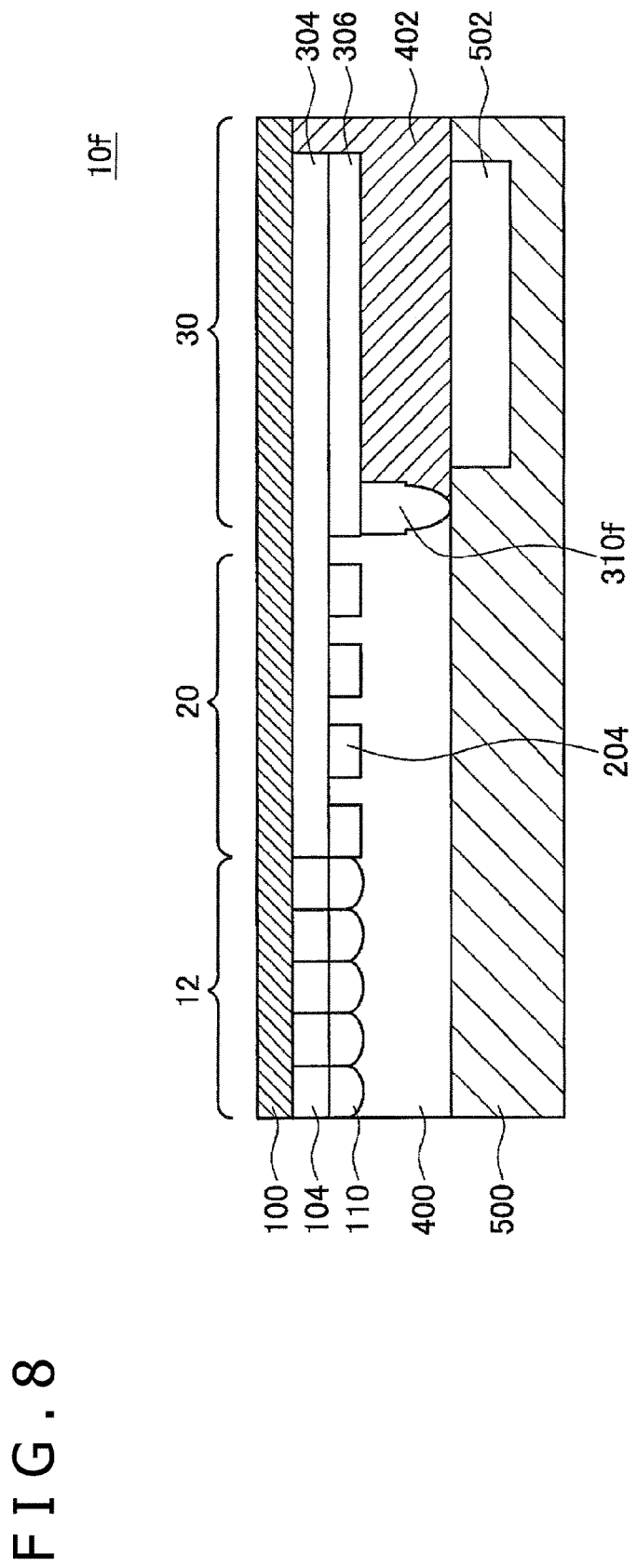
FIG. 8 is a cross-sectional view schematically illustrating an example of a configuration of a display unit 10f according to the fourth embodiment of the present disclosure.

In the description of the first to third embodiments, the tip portion of the protrusion structure 310 has a spherical roundish shape or a flat shape. However, the shape of the protrusion structure 310 according to the embodiments of the present disclosure is not limited to such shapes. Thus, the shape of the protrusion structure 310 will be described in a fourth embodiment of the present disclosure with reference to FIGS. 7 and 8. FIG. 7 is a cross-sectional view schematically illustrating an example of a configuration of a display unit 10e according to the present embodiment, and FIG. 8 is a cross-sectional view schematically illustrating an example of a configuration of a display unit 10f according to the present embodiment. Note that FIGS. 7 and 8 correspond to cross sections of cases in which the display units 10e and 10f are cut along the line A-A' illustrated in FIG. 1.

As described above, the tip portion of the protrusion structure 310 may be in contact with the mounted substrate 500 (including the electrode 502) in the embodiments of the present disclosure. However, in the embodiments of the present disclosure, it is preferable to prevent the tip portion from damaging the mounted substrate 500 side even if the tip portion comes into contact with the mounted substrate 500. Thus, it is preferable that the area of the tip portion of the protrusion substrate 310 in contact with the surface of the mounted substrate 500 be smaller in the embodiments of the present disclosure.

As such, for example, a reflow process or the like is executed to process the tip portion of the protrusion structure 310 into a roundish shape like a lens in the first embodiment, so that the tip portion and the surface of the mounted substrate 500 come into contact in a thin line to form a line contact. In such way, the contact area can be reduced. This can prevent friction between the tip portion and the mounted substrate 500 and can thereby prevent the tip portion from damaging the mounted substrate 500 side.

In addition, as illustrated in FIG. 7, a protrusion structure 310e may have a step-like shape in the fourth embodiment of the present disclosure. Specifically, the protrusion structure 310e is provided on the opposing substrate 100 and has a step-like shape narrowing toward the mounted substrate 500 in cross section.

As described above, the strength for preventing the entrance of the photocurable resin 400 while preventing damage on the mounted substrate 500 side needs to be secured for the protrusion structure 310. Thus, the tip portion of the protrusion structure 310e can be thinned to reduce the contact area of the tip portion and the mounted substrate 500 in the present embodiment, and this can prevent the damage on the mounted substrate 500 side. Further, in the present embodiment, the width of the protrusion structure 310e on the opposing substrate 100 side can be widened to secure the strength of the protrusion structure 310e for preventing the entrance of the photocurable resin 400.

In addition, as illustrated in FIG. 8, a protrusion structure 310f may configured in such a manner that a section thereof on the opposing substrate 100 side with a rectangular shape in cross section and a section of the mounted substrate 500 side with a brush tip shape in cross section are placed on top of each other in the fourth embodiment of the present disclosure. Such a configuration can also reduce the contact area of the tip portion and the mounted substrate 500 because the tip portion of the protrusion structure 310f has a brush tip shape, and this can prevent the damage on the mounted substrate 500 side. Further, according to the configuration, the protrusion structure 310f includes a section on the opposing substrate 100 side with a rectangular shape in cross section, and the width of the section of the protrusion structure 310f on the opposing substrate 100 side (length in the left and right direction in FIG. 8) can be widened. As a result, according to the present configuration, the strength of the protrusion structure 310f for preventing the entrance of the photocurable resin 400 can be secured.

Furthermore, the protrusion structure 310 is not limited to the shapes illustrated in FIGS. 2 to 8 in the embodiments of the present disclosure. For example, the protrusion structure 310 may be provided on the opposing substrate 100 and may have a tapered shape becoming thinner toward the mounted substrate 500 in cross section.

6. Conclusion

In this way, according to the embodiments of the present disclosure, providing the protrusion structure 310 can prevent the photocurable resin 400 from entering the thermosetting resin 402 side of the light-blocking region 30. As a result, the present embodiments can narrow down the width of the slit region 20 as a buffer for preventing the photocurable resin 400 from entering the light-blocking region 30, while curing the entered photocurable resin 400 and can widen the pixel region 12. Further, in the present embodiments, even in the case where the photocurable resin 400 comes below or around the protrusion structure 310, the light transmitted through the protrusion structure 310 can cure the photocurable resin 400 because the protrusion structure 310 includes a transparent or semitransparent material that transmits light. That is, the present embodiments can prevent the photocurable resin 400 from being uncured and can also prevent the photocurable resin 400 from entering the light-blocking region 30 from the pixel region 12.

Further, the embodiments of the present disclosure can be combined with each other and carried out. For example, the second embodiment and the third embodiment may be combined to provide a plurality of protrusion structures 310 including a plurality of color filters 314. In addition, for example, the second embodiment and the fourth embodiment may be combined to provide a plurality of protrusion structures 310 with a step-like shape in cross section.

In addition, methods, apparatuses, and conditions used for manufacturing a general semiconductor apparatus (including a package) can be used to manufacture the display unit 10 according to the present embodiments. For example, a spin coating method, a sputtering method, a CVD (Chemical Vapor Deposion) method, a photolithography method, an etching method, a CMP (Chemical Mechanical Polish) method, metal plating, and the like can appropriately be used to manufacture the opposing substrate 100 and the mounted substrate 500 included in the display unit 10 according to the present embodiments. Furthermore, an existing manufacturing process of a semiconductor apparatus can be used to seal the opposing substrate 100 and the mounted substrate 500 included in the display unit 10 according to the present embodiments. That is, an existing manufacturing process of a semiconductor apparatus can be used to easily and inexpensively manufacture the display unit 10 according to the present embodiments.

7. Application Examples

Figure 9:
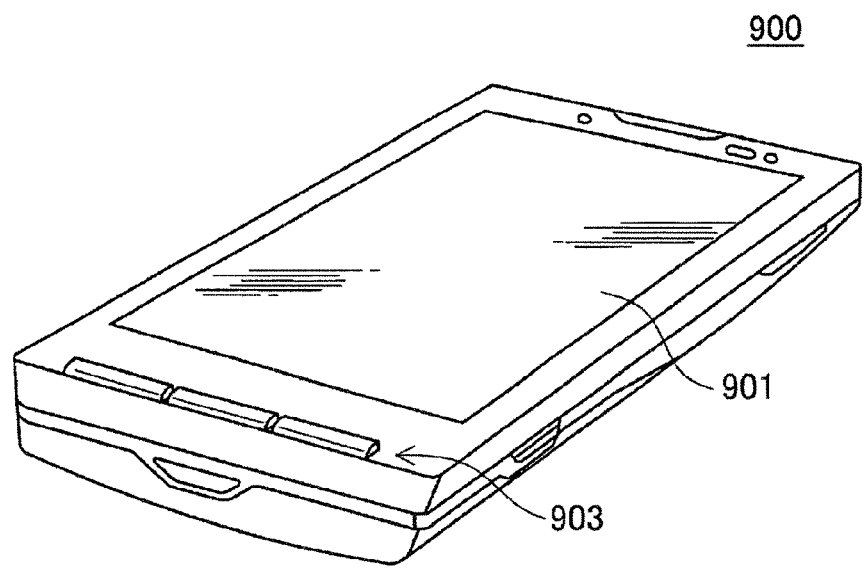
FIG. 9 is an external view illustrating an example of electronic equipment in which the display unit 10 according to the embodiments of the present disclosure can be applied.
Figure 10:
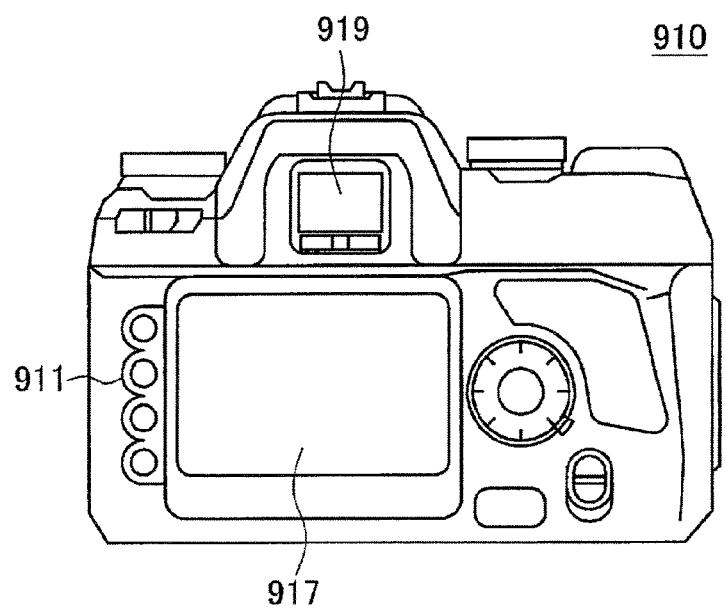
FIG. 10 is an external view illustrating another example of the electronic equipment in which the display unit 10 according to the embodiments of the present disclosure can be applied.
Figure 11:
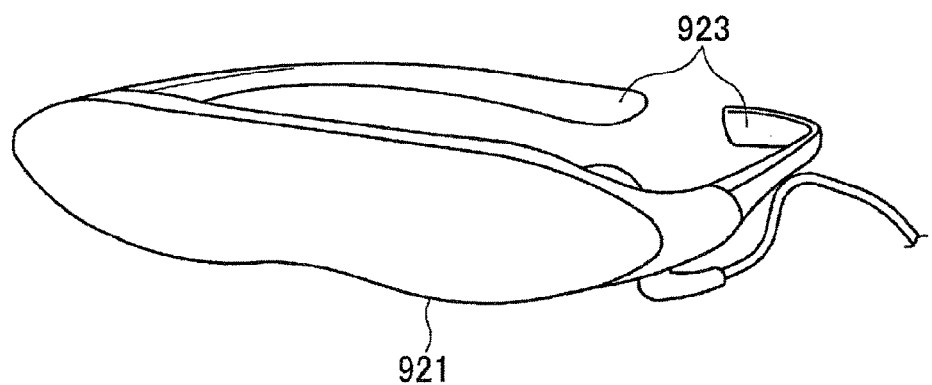
FIG. 11 is an external view illustrating yet another example of the electronic equipment in which the display unit 10 according to the embodiments of the present disclosure can be applied.

Next, application examples of the display units 10 according to the embodiments of the present disclosure will be described with reference to FIGS. 9 to 11. FIGS. 9 to 11 are external views illustrating examples of electronic equipment in which the display unit 10 according to the embodiments of the present disclosure can be applied.

For example, the display unit 10 according to the present embodiments can be applied to a display section included in such electronic equipment as a smartphone. Specifically, as illustrated in FIG. 9, a smartphone 900 includes a display section 901 that displays various types of information and an operation unit 903 including buttons and the like for receiving an operation input of the user. The display section 901 can be the display unit 10 according to the present embodiments. In addition, for example, a control unit (display control unit) (not illustrated) that includes a CPU (Central Processing Unit) and controls various functional units of the smartphone 900, such as the display section 901, is provided inside the smartphone 900.

In addition, the display unit 10 according to the present embodiments can be applied to, for example, a display section of such electronic equipment as a digital camera. Specifically, as illustrated in FIG. 10 depicting an external view of a digital camera 910 as viewed from the back (photographer side), the digital camera 910 includes a body unit (camera body) 911, a monitor unit 917 that displays various types of information, and an EVF (Electronic View Finder) 919 that displays a through-the-lens image observed by the user during photographing. Here, the monitor unit 917 and the EVF 919 can be the display unit 10 according to the present embodiments. In addition, for example, a control unit that includes a CPU and controls various functional units of the digital camera 910, such as the monitor unit 907, is provided inside the body unit 911.

In addition, for example, the display unit 10 according to the present embodiments can be applied to a display section of such electronic equipment as an HMD. Specifically, as illustrated in FIG. 11, an HMD 920 includes an eyeglass-type display section 921 that displays various types of information and an ear hook unit 923 hooked on the ears of the user when the user wears the HMD 920. Here, the display section 921 can be the display unit 10 according to the present embodiments.

Note that the electronic equipment in which the display unit 10 according to the present embodiments can be applied is not limited to the examples described above. The display unit 10 according to the present embodiments can be applied to a display section of electronic equipment in any field that displays an image, based on an image signal input from the outside or an image signal generated inside. Examples of such electronic equipment include a television apparatus, an electronic book, a PDA (Personal Digital Assistant), a notebook personal computer, a video camera, and a gaming device.

8. Supplement

While the preferred embodiments of the present disclosure have been described above in detail with reference to the attached drawings, the technical scope of the present disclosure is not limited to the examples. It is apparent that those with normal knowledge in the technical field of the present disclosure can make various changes or modifications within the scope of the technical idea described in the claims, and it is understood that the changes and the modifications obviously belong to the technical scope of the present disclosure.

In addition, the advantageous effects described in the present specification are explanatory or illustrative only, and are not restrictive. That is, the technique according to the present disclosure can attain other advantageous effects that are apparent to those skilled in the art from the description of the present specification, in addition to or in place of the advantageous effects described above.

Note that the following configuration also belongs to the technical scope of the present disclosure.

(1)
A semiconductor apparatus including:
a layered structure in which a first substrate provided with a light-emitting element and a second substrate provided with a light-blocking member on a periphery are layered with each other,
the layered structure including
a first resin including a photocurable resin that seals a part between the first substrate and the second substrate in a pixel region positioned at a center in plan view of the layered structure,
a second resin that seals a part between the first substrate and the second substrate in a light-blocking region positioned on a periphery in plan view of the layered structure, and
a protrusion structure provided between the first substrate and the second substrate in a boundary region between the pixel region and the light-blocking region, the protrusion structure including a transparent or semi-transparent material that transmits light.

(2)
The semiconductor apparatus according to (1), in which the second resin includes a thermosetting resin.

(3)
The semiconductor apparatus according to (1) or (2), in which
a plurality of lenses is provided at a center of the second substrate in plan view, and
the protrusion structure includes the same material as the material of the lenses.

(4)
The semiconductor apparatus according to any one of (1) to (3), in which
the light-blocking member includes layered color filters, and
the protrusion structure includes the same material as the material of the color filters.

(5)
The semiconductor apparatus according to any one of (1) to (4), in which
the protrusion structure is provided to surround the pixel region in plan view of the layered structure.

(6)
The semiconductor apparatus according to (3), in which
the protrusion structure is provided on the second substrate and has a shape protruding toward the first substrate.

(7)
The semiconductor apparatus according to (6), in which
a tip portion of the protrusion structure is positioned closer to the first substrate with respect to a vertex of each of the lenses.

(8)
The semiconductor apparatus according to (6), in which
an electrode is provided on the second substrate so as to face the light-blocking member in the layered structure, and
the protrusion structure is positioned closer to the pixel region with respect to the electrode in plan view of the layered structure.

(9)
The semiconductor apparatus according to (8), in which
the protrusion structure is in contact with the second substrate.

(10)
The semiconductor apparatus according to (6), in which
an electrode is provided on the second substrate so as to face the light-blocking member in the layered structure, and
the protrusion structure faces an edge portion of the electrode on the pixel region side.

(11)
The semiconductor apparatus according to (10), in which
the protrusion structure is in contact with the electrode.

(12)
The semiconductor apparatus according to any one of (6) to (11), in which
the protrusion structure includes a roundish tip portion.

(13)
The semiconductor apparatus according to (12), in which
at least part of a surface of the tip portion is covered by the first resin.

(14)
The semiconductor apparatus according to (12) or (13), in which at least part of the surface of the tip portion is covered by the second resin.

(15)
The semiconductor apparatus according to any one of (1) to (14), in which a slit structure that partially blocks light is provided between the protrusion structure and the pixel region in plan view of the layered structure.

(16)
The semiconductor apparatus according to any one of (1) to (15), in which the layered structure includes a plurality of the protrusion structures lined up in a direction from the pixel region toward the light-blocking region.

(17)
The semiconductor apparatus according to (16), in which
lengths of the plurality of protrusion structures in a layer direction of the layered structure sequentially increase in the direction from the pixel region toward the light-blocking region.

(18)
A display apparatus including:
a display section including a layered structure in which a first substrate provided with a light-emitting element and a second substrate provided with a light-blocking member on a periphery are layered with each other; and
a display control unit that controls the display section,
the layered structure including
a first resin including a photocurable resin that seals a part between the first substrate and the second substrate in a pixel region positioned at a center in plan view of the layered structure,
a second resin that seals a part between the first substrate and the second substrate in a light-blocking region positioned on a periphery in plan view of the layered structure, and
a protrusion structure provided between the first substrate and the second substrate in a boundary region between the pixel region and the light-blocking region, the protrusion structure including a transparent or semi-transparent material that transmits light.

(19)
Electronic Equipment Including:
a display section including a layered structure in which a first substrate provided with a light-emitting element and a second substrate provided with a light-blocking member on a periphery are layered with each other; and
a control unit that controls the display section, the layered structure including
a first resin including a photocurable resin that seals a part between the first substrate and the second substrate in a pixel region positioned at a center in plan view of the layered structure,
a second resin that seals a part between the first substrate and the second substrate in a light-blocking region positioned on a periphery in plan view of the layered structure, and
a protrusion structure provided between the first substrate and the second substrate in a boundary region between the pixel region and the light-blocking region, the protrusion structure including a transparent or semitransparent material that transmits light.

REFERENCE SIGNS LIST 10, 10a, 10b, 10c, 10d, 10e, 10f, 90: Display unit
12: Pixel region
20: Slit region
30: Light-blocking region
100: Opposing substrate
104, 204, 304, 306, 314: Color filter
110, 320: Micro-lens
310, 310a, 310b, 310c, 310d, 310e, 310f: Protrusion structure
400: Photocurable resin
402: Thermosetting resin
500: Mounted substrate
502: Electrode
900: Smartphone
901, 921: Display section
903: Operation unit
910: Digital camera
911: Body unit
917: Monitor unit
919: EVF
920: HMD
923: Ear hook unit

The invention claimed is:

1. A semiconductor apparatus comprising:
a layered structure in which a first substrate provided with a light-emitting element and a second substrate provided with a light-blocking member on a periphery are layered with each other,
the layered structure including
a first resin including a photocurable resin that seals a part between the first substrate and the second substrate in a pixel region positioned at a center in plan view of the layered structure,
a second resin that seals a part between the first substrate and the second substrate in a light-blocking region positioned on a periphery in plan view of the layered structure, and
a protrusion structure provided between the first substrate and the second substrate in a boundary region between the pixel region and the light-blocking region, the protrusion structure including a transparent or semitransparent material that transmits light.

2. The semiconductor apparatus according to claim 1, wherein the second resin includes a thermosetting resin.

3. The semiconductor apparatus according to claim 1, wherein a plurality of lenses is provided at a center of the second substrate in plan view, and the protrusion structure includes a same material as a material of the lenses.

4. The semiconductor apparatus according to claim 1, wherein the light-blocking member includes layered color filters, and the protrusion structure includes a same material as a material of the color filters.

5. The semiconductor apparatus according to claim 1, wherein
the protrusion structure is provided to surround the pixel region in plan view of the layered structure.

6. The semiconductor apparatus according to claim 3, wherein
the protrusion structure is provided on the second substrate and has a shape protruding toward the first substrate.

7. The semiconductor apparatus according to claim 6, wherein
a tip portion of the protrusion structure is positioned closer to the first substrate with respect to a vertex of each of the lenses.

8. The semiconductor apparatus according to claim 6, wherein
an electrode is provided on the second substrate so as to face the light-blocking member in the layered structure, and
the protrusion structure is positioned closer to the pixel region with respect to the electrode in plan view of the layered structure.

9. The semiconductor apparatus according to claim 8, wherein
the protrusion structure is in contact with the second substrate.

10. The semiconductor apparatus according to claim 6, wherein
an electrode is provided on the second substrate so as to face the light-blocking member in the layered structure, and
the protrusion structure faces an edge portion of the electrode on the pixel region side.

11. The semiconductor apparatus according to claim 10, wherein
the protrusion structure is in contact with the electrode.

12. The semiconductor apparatus according to claim 6, wherein
the protrusion structure includes a roundish tip portion.

13. The semiconductor apparatus according to claim 12, wherein
at least part of a surface of the tip portion is covered by the first resin.

14. The semiconductor apparatus according to claim 12, wherein
at least part of a surface of the tip portion is covered by the second resin.

15. The semiconductor apparatus according to claim 1, wherein
a slit structure that partially blocks light is provided between the protrusion structure and the pixel region in plan view of the layered structure.

16. The semiconductor apparatus according to claim 1, wherein
the layered structure includes a plurality of the protrusion structures lined up in a direction from the pixel region toward the light-blocking region.

17. The semiconductor apparatus according to claim 16, wherein
lengths of the plurality of protrusion structures in a layer direction of the layered structure sequentially increase in the direction from the pixel region toward the light-blocking region.

18. A display apparatus comprising:

a display section including a layered structure in which a first substrate provided with a light-emitting element and a second substrate provided with a light-blocking member on a periphery are layered with each other; and a display control unit that controls the display section, the layered structure including

- a first resin including a photocurable resin that seals a part between the first substrate and the second substrate in a pixel region positioned at a center in plan view of the layered structure,
- a second resin that seals a part between the first substrate and the second substrate in a light-blocking region positioned on a periphery in plan view of the layered structure, and
- a protrusion structure provided between the first substrate and the second substrate in a boundary region between the pixel region and the light-blocking region, the protrusion structure including a transparent or semitransparent material that transmits light.

19. Electronic equipment comprising:

a display section including a layered structure in which a first substrate provided with a light-emitting element and a second substrate provided with a light-blocking member on a periphery are layered with each other; and a control unit that controls the display section, the layered structure including

- a first resin including a photocurable resin that seals a part between the first substrate and the second substrate in a pixel region positioned at a center in plan view of the layered structure,
- a second resin that seals a part between the first substrate and the second substrate in a light-blocking region positioned on a periphery in plan view of the layered structure, and
- a protrusion structure provided between the first substrate and the second substrate in a boundary region between the pixel region and the light-blocking region, the protrusion structure including a transparent or semitransparent material that transmits light.

* * * * *